US008143615B2

(12) United States Patent
Nishitani

(10) Patent No.: US 8,143,615 B2
(45) Date of Patent: Mar. 27, 2012

(54) ELECTRON BEAM EMITTING DEVICE WITH A SUPERLATTICE STRUCTURE

(75) Inventor: Tomohiro Nishitani, Saitama (JP)

(73) Assignee: Riken, Wako-shi, Saitama (JP)

( * ) Notice: Subject to any disclaimer, the term of this patent is extended or adjusted under 35 U.S.C. 154(b) by 25 days.

(21) Appl. No.: 12/589,661

(22) Filed: Oct. 27, 2009

(65) Prior Publication Data

US 2010/0108983 A1 May 6, 2010

(30) Foreign Application Priority Data

Oct. 29, 2008 (JP) ................................ 2008-278867

(51) Int. Cl.
*H01L 29/06* (2006.01)

(52) U.S. Cl. .... 257/21; 257/184; 257/440; 257/E21.097

(58) Field of Classification Search .................... 257/21, 257/184, 440, 372
See application file for complete search history.

(56) References Cited

U.S. PATENT DOCUMENTS 5,296,720 A * 3/1994 Wen et al. ........................ 257/21
5,510,627 A * 4/1996 Snow ............................... 257/21
5,563,423 A * 10/1996 Wu et al. .......................... 257/21
5,877,510 A * 3/1999 Baba et al. ....................... 257/21
6,130,466 A * 10/2000 Schneider et al. ............ 257/440
6,875,975 B2 * 4/2005 Faska et al. ................ 250/214.1
7,286,585 B2 * 10/2007 Johnson ..................... 372/43.01
7,381,966 B2 * 6/2008 Starikov et al. ............... 250/372
7,838,869 B2 * 11/2010 Perera et al. ..................... 257/21
2003/0086461 A1 * 5/2003 Kudo et al. ...................... 372/45
2005/0157765 A1 * 7/2005 Johnson .......................... 372/39
2005/0205857 A1 * 9/2005 Sundaram et al. .............. 257/14
2005/0258415 A1 * 11/2005 Perera et al. .................... 257/14

FOREIGN PATENT DOCUMENTS

JP 06111714 4/1994
JP 06115221 5/1994

OTHER PUBLICATIONS http://www.semi.te.chiba-u.jp/mqw.htm (Yoshikawa Laboratory, Dept. of Electronic and Mechanical Engineering, Faculty of Engineering, Chiba Univ., May 2008).

* cited by examiner

*Primary Examiner* — Zandra Smith
*Assistant Examiner* — Tsz Chiu
(74) *Attorney, Agent, or Firm* — Ohlandt, Greeley, Ruggiero & Perle, L.L.P.

(57) ABSTRACT

A superlattice structure comprises a plurality of well layers made of first semiconductor and a plurality of barrier layers made of second semiconductor that has a band gap wider than that of the first semiconductor, wherein both layers are deposited alternately, and wherein a maximum thickness of each of the wall and barrier layers is such that a band gap between a lower limit of a mini band generated in a conduction band and an upper limit of a mini band generated in a valence band is a given width in the energy state of electron of the superlattice structure, and a minimum thickness of each of the wall and the barrier layers is such that a bandwidth of a mini band generated in the conduction band is a given width in the energy state of electron of the superlattice structure.

9 Claims, 7 Drawing Sheets

ELECTRON BEAM EMITTING DEVICE WITH A SUPERLATTICE STRUCTURE

CROSS-REFERENCED APPLICATION

The present disclosure claims priority to Japanese patent application No. 2008-278867 filed on Oct. 29, 2008, and the entire disclosure of the application is incorporated herein by reference.

BACKGROUND

1. Field of the Disclosure

The present disclosure relates to a photocathode semiconductor that improves generation of mono-energetic electrons, quantum efficiency and its lifetime by using a superlattice structure. The photocathode semiconductor device is a suitable electron source for high brightness and long lifetime.

2. Description of the Related Art

Conventionally, various techniques are proposed to apply photocathode semiconductor devices as electron sources for accelerators, electronic microscopes, inverse photoelectron spectroscopy or other. The principle of photocathode semiconductor devices is based on a photo electron emission phenomenon that occurs when a semiconductor material is irradiated with a laser-light.

One such technique is disclosed in Japanese Patent No. 3154569 and Japanese Patent No. 2606131 identified below. http://www.semi.te.chiba-u.jp/mqw.htm. (Yoshikawa laboratory, Department of Electronic and Mechanical Engineering, Faculty of Engineering, Chiba University; the page is as of May, 2008) discloses a technique directed to a superlattice structure, also called as a multi-quantum-well structure.

A quantum-well structure is formed by using two or more material with different band gaps or different doping concentration so that a material is held between layers of another material that has the potential offset in the conduction band or the valence band.

The quantum well structure has one layer called "well layer" that has a small band gap and by which electrons and holes are confined, and another layer called "barrier layer" with a wide band gap that serves as a barrier for the carriers.

A multi-quantum-well structure refers to one type of quantum well structure with multiply provided well layers, distinguished from that which has a singular well layer, called a single quantum well structure.

As for the energy levels of electron, energy bands as observed in a common semiconductor material are also seen in the quantum well structure. In addition to the normal energy bands, the quantum well structure produces discrete energy "sub bands" or "mini bands" in a conduction band or a valence band thereof.

Electrons can transit between those mini bands.

Japanese Patent No. 3154569 discloses quantum efficiency improvement without degradation of polarization in a polarized electron source. This is achieved by providing a semiconductor multilayer mirror underneath an undersurface of a second semiconductor (strained GaAs semiconductor) layer of the electron source. The second semiconductor emits polarized electrons when an excited laser is applied thereto and the multilayer mirror causes multiple reflection of the excited laser between itself and the top surface of the second semiconductor. This yields increase of amount of light energy absorption in the second semiconductor layer without necessity of increasing the thickness of the second semiconductor.

Japanese Patent No. 2606131 forth an objective of achieving an excellent compromise between a high degree of spin polarization and high quantum efficiency in a semiconductor spin polarization electron source, and discloses providing the following elements on a substrate: A block layer having an electron affinity lower than the substrate and having a thickness of equal to or less than the electron wave length. As a region to produce spin polarized electrons a p-type conductive, a short-period strained superlattice structure that does not cause lattice relaxation and comprises a strained well layer having a lattice constant larger than that of the substrate and a thickness of less than the electron wave length, and a barrier layer having a lower energy of valence band than the strained well layer. A surface layer absorbing band bending.

In this structure, by receiving a compressive stress, the strained quantum well layer produces a further wide gap of energies between a band of heavy holes and a band of light holes, which occur in a valence band of the superlattice structure.

Accordingly, realization of a photocathode semiconductor device having a capacity against a large current needed to generate high brightness electron beam based on the use of a superlattice structure, is eagerly sought.

The present disclosure is made in view of the above, and its objective is providing a photocathode semiconductor device having a capacity against a large current to generate high brightness electron beam by using a superlattice structure.

SUMMARY

A photocathode semiconductor device according to a first aspect of the present disclosure comprises a plurality of well layers made of a first semiconductor and a plurality of barrier layers made of a second semiconductor having a band gap wider than the first semiconductor, wherein both layers are laminated alternately. The photocathode semiconductor device is configured as follows.

That is, a maximum thickness of each of the wall and barrier layers is such that a band gap between a lower limit of a mini band generated in a conduction band and an upper limit of a mini band generated in a valence band is a given width in the energy state of the electron of the superlattice structure, and a minimum thickness of each of the wall and the barrier layers is such that a bandwidth of a mini band generated in the conduction band is a given width in the energy state of electron of the superlattice structure.

The photocathode semiconductor device may be so configured that a density state of the miniband generated in the conduction band is a desired magnitude.

One end surface of the superlattice structure, referred hereafter to as an electron emission surface, may be one of the plurality of well layers hereafter referred to as a top surface side well layers. The photocathode semiconductor device of the present disclosure may further comprise a surface layer made of third semiconductor and being in contact with the top surface side well layer. An electron beam whose energy state is monochromatized is emitted from a lowermost mini band of a conduction band when the superlattice structure is irradiated with a light having such a wavelength that excites an electron of an uppermost mini band of the valence band to the lowermost mini band of the conduction band, in the energy state of the superlattice structure.

In this state, the light may be applied to the electron emission surface via the surface layer.

Further, in the photocathode semiconductor device of the present disclosure, an other end surface of the superlattice structure, hereafter referred to as a substrate surface, is another one of the plurality of well layers, hereafter referred to as a substrate-side well layer, or one of the plurality of barrier layers. The photo cathode semiconductor device may comprise may further comprise a buffer layer made of a fourth semiconductor layer and being in contact with a substrate layer, and a substrate layer made of a fifth semiconductor and being in contact with a substrate layer.

Further, the photocathode semiconductor device of the present disclosure may be configured as follows.

That is, the surface layer is made of third semiconductor comprising a GaAs semiconducting crystal in which p-type impurity is doped by an among of equal to or less than $1\times10^{18}$ $cm^{-3}$ and which has a thickness of 3 to 6 nm.

On the other hand, each of the plurality of barrier layers is made of the second semiconductor comprising an AlGaAs semiconducting crystal in which relative proportion of Al to GA is 0.25 to 0.30, and in which p-type impurity is doped by an amount of equal to or less than $5\times10^{18}$ $cm^{-3}$, and has a thickness of 3 to 6 nm.

Further, each of the plurality of well layers is made of the first conductor comprising a GaAs semiconducting crystal in which p-type impurity is doped by an amount of equal to or less than $5\times10^{18}$ $cm^{-3}$.

The buffer layer is made of fourth semiconductor comprising an AlGaAs semiconducting crystal in which p-type impurity is doped by an amount of equal to or less than $5\times10^{19}$ $cm^{-3}$, and which has a thickness of equal to or greater than 1 μm.

The substrate layer is made of a GaAs semiconducting material.

The thickness of the super lattice structure is 2 μm to 3 μm.

The substrate layer is made of a GaAs semiconducting material.

Be is used for the p-type doping.

According to the present disclosure, it is possible to provide a photocathode semiconductor device that improves generation of mono-energetic electrons, quantum efficiency and its lifetime by using a superlattice structure. The photocathode semiconductor device is suitable electron source for high brightness and long lifetime.

BRIEF DESCRIPTION OF THE DRAWINGS

These and other advantages of the present disclosure will be apparent to those of ordinary skill in the art by reference to the following detailed description and the accompanying drawings in which.

DETAILED DESCRIPTION OF THE PREFERRED EMBODIMENTS

Embodiments of the present disclosure will be described below. The embodiments described below are provided to give explanations, not to limit the scope of the present disclosure. Therefore, those skilled in the art can adopt embodiments in which some or all of the elements herein have been replaced with respective equivalents, and such embodiments are also to be included within the scope of the present disclosure.

Embodiment 1

Figure 1:
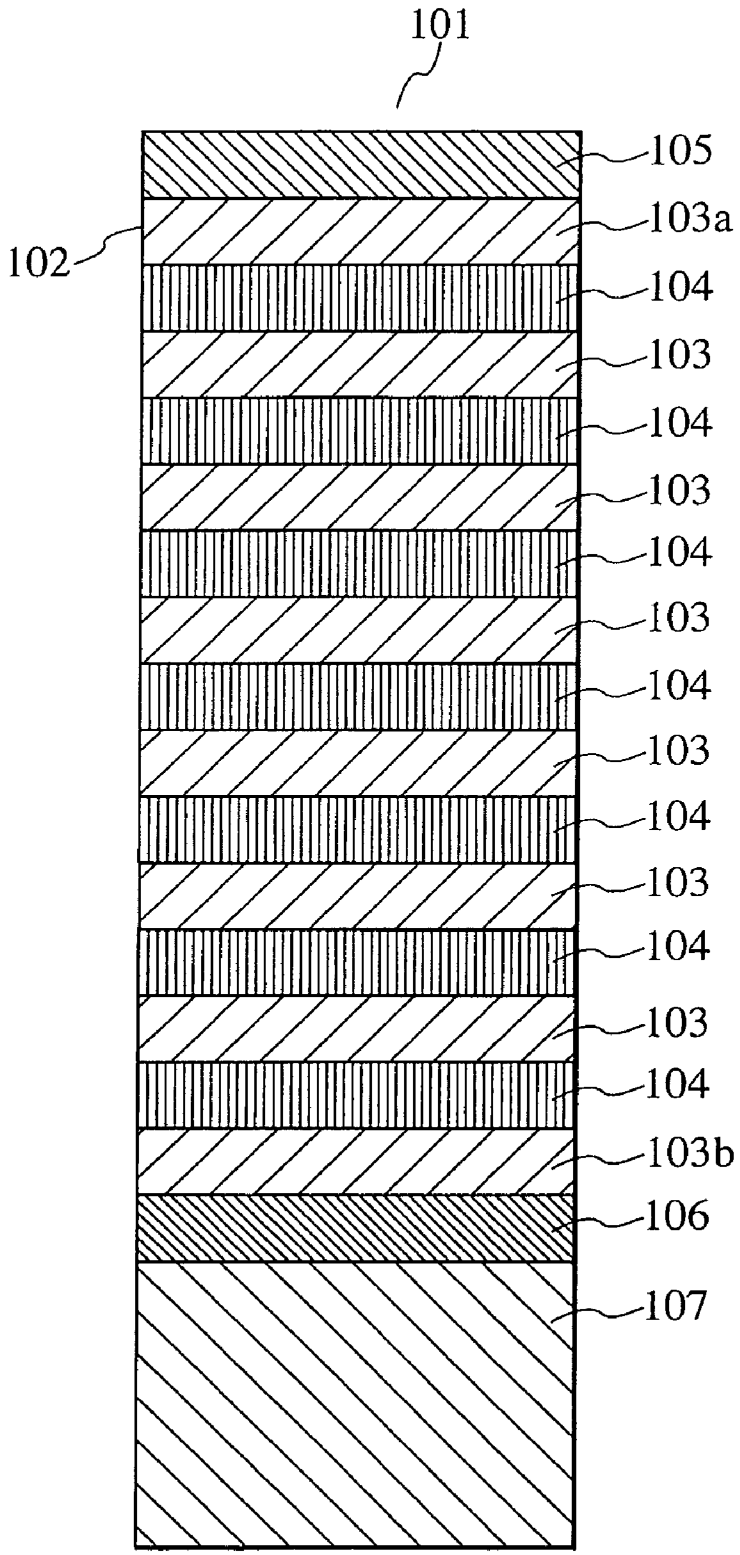
FIG. 1 is a cross-sectional view showing a configuration of the photocathode semiconductor device according to one embodiment of the present disclosure.

FIG. 1 shows a cross-section of a photocathode semiconductor device according to an embodiment of the present disclosure. The explanation is given with reference to this diagram.

A photocathode semiconductor device 101 according to an embodiment of the present disclosure comprises a superlattice structure 102.

The superlattice structure 102 is formed by comprising a plurality of well layers 103 made of a first semiconductor and a plurality of barrier layers 104 made of a second semiconductor, wherein both layers are deposited alternately.

The second semiconductor has a band gap that is wider than the first semiconductor.

In this embodiment, one end surface of the laminated structure of the superlattice structure 102 is used as "electron emission surface". When light enters the electron emission surface, electrons are emitted. One end surface of the laminated structure of the superlattice structure 102 is referred to as "light entrance surface". In this embodiment, one of the well layers 103 serves as the light entrance surface. Such a well layer 103 is referred to as a surface-side well layer 103*a*.

The barrier layer 104 may be used as the electron emission surface.

A surface layer 105 made of third semiconductor is disposed on an outermost, exposed surface of surface-side well layer 103*a*.

The surface layer 105 has a high doping density of p-type impurities to achieve a low electron affinity so that band bending is caused.

The light may not be applied to the surface layer 105 as located in this figure, and may be applied to a side surface or other surface of the device of the present embodiment.

On the other hand, the other end surface (hereafter referred to as substrate surface) is one of the well layers 103 in the example shown in this figure. This well layer 103 is referred to as a substrate surface side well layer 103*b*. In the superlattice structure 102, one of the barrier layer 104 may also be located as the layer of the substrate surface side.

The substrate surface side well layer 103*b* is disposed on a substrate layer 107 made of a fifth semiconductor having a band gap smaller than that of the superlattice structure 102 on the buffer layer 106 that intervenes between the side well layer 103*b* and the substrate layer 107.

The layers in the present embodiment are formed into the following structure.

That is, the surface layer 105 is made of a third semiconductor comprising a GaAs semiconducting crystal in which p-type impurity is doped by an amount of equal to or less than $1\times10^{18}$ $cm^{-3}$ and which has a thickness denoted "A".

On the other hand, each of the plurality of barrier layers 104 comprises second semiconductor comprising an AlGaAs semiconducting crystal in which relative proportion of Al to GA is 0.25 to 0.30, and in which p-type impurity is doped by an amount of equal to or less than $5\times10^{18}$ $cm^{-3}$, and has a thickness denoted "Lb".

Further, each of the plurality of well layers 103 is made of first semiconductor comprising GaAs semiconducting crystal in which p-type impurity is doped by an amount of equal to or less than $5\times10^{18}$ $cm^{-3}$ and which has a thickness denoted "Lw".

Buffer layer 106 is made of the fourth semiconductor comprising an AlGaAs semiconducting crystal in which p-type impurity is doped by an amount of equal to or less than $5\times10^{19}$ $cm^{-3}$, and has a thickness denoted as "B".

On the other hand, the substrate layer 107 is made of GaAs semiconductor.

Further, the thickness of the superlattice structure 102 is denoted as S.

Be is used for the p-type doping.

Various methods can be employed for the growth of crystal in forming the superlattice structure 102 having the structure as described above. For example, molecular beam epitaxy can be used in the same manner as the technique described in Japanese Patent No. 2606131.

Figure 2:
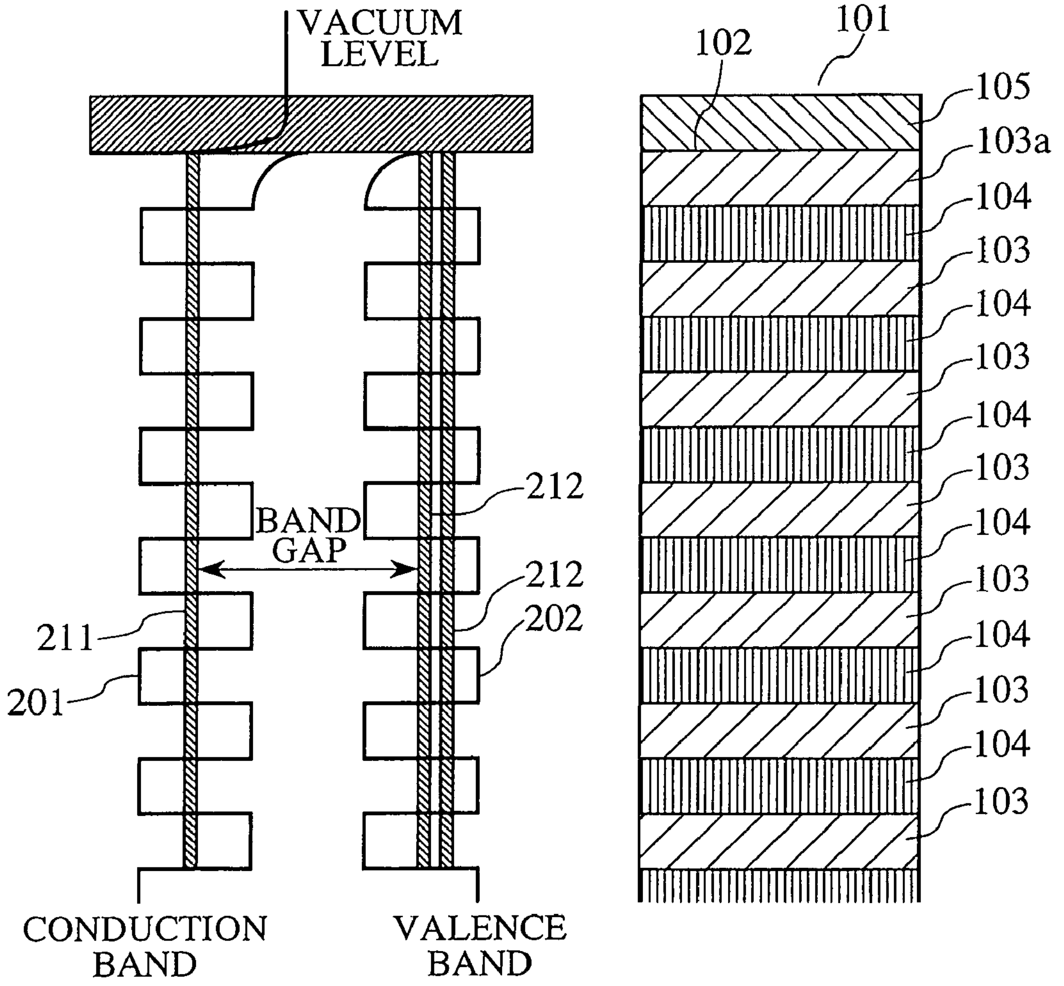
FIG. 2 is a diagrammatic illustration of a band structure with respect to a superlattice structure.

FIG. 2 illustrates a band structure in the formation of the superlattice structure 102. The following explanations reference to this diagram.

As shown in this diagram, well layers 103 and barrier layers 104 are deposited alternately, so that a conductor band 201 and a valence band 202 have a comb shape.

In each of the well layers 103, the conductor band 201 and the valence band 202 come close to each other. In each of the barrier layers 104, the conductor band 201 and the valence band 202 come away from each other.

The distance between the conductor band 201 and the valence band 202 is called a band gap. For the band structure to have a comb shape in the superlattice structure 102, the structure should be such that the second semiconductor that forms barrier layer 104 has a band gap wider than the band gap of the first semiconductor that forms the well layer 103.

Such a superlattice structure 102 is also called as a multi-quantum well structure, in which electrons and holes are confined within the well layer 103 made of a material whose band gap is the smaller.

In addition to the formation of the comb-shaped band structure, a mini band 211 is generated in the conductor band 201 and a miniband 212 is generated in the valence band 202.

In the present embodiment, the surface layer 105 uses a gallium arsenic semiconductor having a bulk crystal structure, whose surface is treated by NEA (Negative Electron Affinity) surface treatment. The present embodiment can be considered to be a variant of the NEA-GaAs photocathode semiconductor device.

By the NEA surface treatment, if a band gap exists in the electron states, a vacuum level may exist in a level lower than the lower limit of the mini band 211 of the conductor band 201. In this case, the electrons excited from the valence band 202 to the conductor band 201 can transit to the vacuum level without any obstacle. That is, by the excitation caused at a room temperature or a temperature lower than it, electrons excited to the conductor band 201 are emitted to the vacuum.

In the present embodiment, the electrons excited from the mini band 212 generated in the valence band 202 to the mini band 211 generated in the conductor band 201 by the application of light is output as an electron beam by passing the NEA surface.

In order to improve the quantum efficiency, a large absorption coefficient is needed. For this purpose, the energy state density of the electrons of the mini band 211 in the conductor band 201 is made larger, and a band gap between a lower limit of the mini band 211 of the conductor band 201 and the upper limit of the mini band 212 in the valence band 202 should be made larger. For example, the band gap is, preferably, larger than 1.42 eV when GaAs semiconductor is used.

The wavelength of the light applied is determined to correspond to the lower limit of the mini band 211 within the conductor band 201 and the upper limit of the mini band 212 in the valence band 202. In the present embodiment, a laser lay is used.

To achieve a small initial emittance, the width of a mini band 211 in the conductor band 201 should be reduced. For example, desirably, the room temperature energy is less than 26 meV. Structured so, the energy state of the electron beam output can be monochromarized.

Accordingly, the thickness Lw of the well layer 103 and the thickness Lb of the barrier layer 104 should be set so that these values are desired values.

In the present embodiment, by varying parameters Lw and Lb to conduct a simulative calculation with Kronig-Penney model, desirable ranges of Lw and Lb can be obtained.

Figure 3:
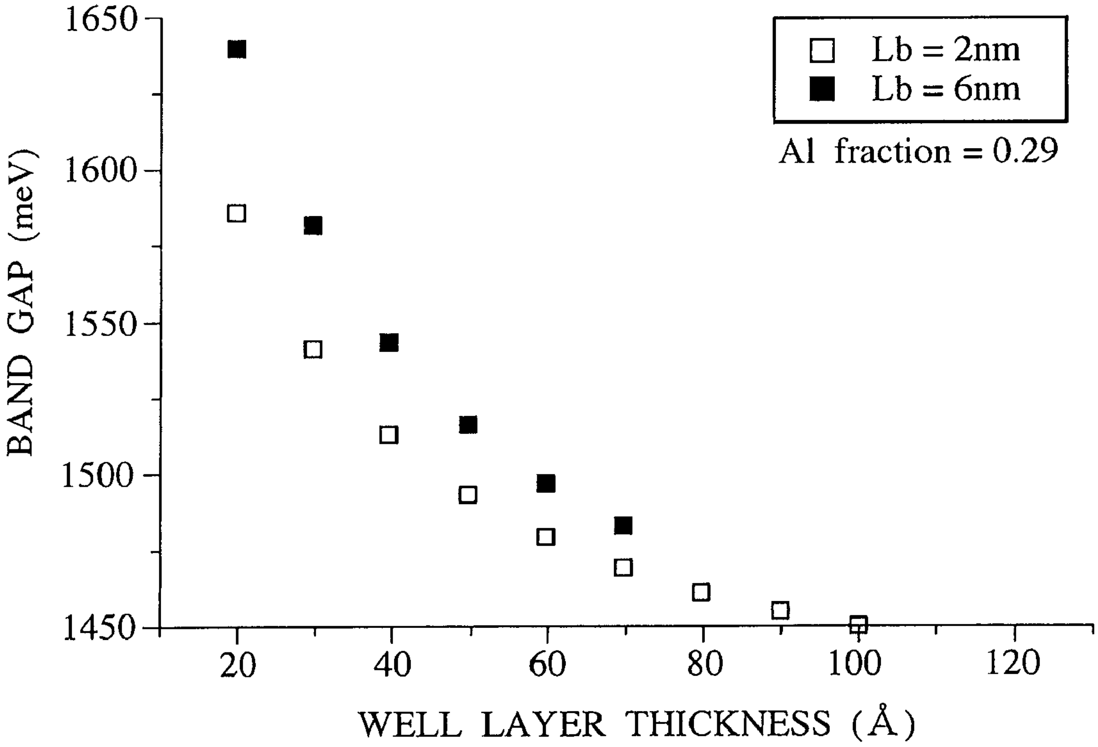
FIG. 3 shows a graph showing a change of a band gap of the superlattice structure according to a change of a thickness of a well layer Lw, for each of the cases where the thickness Lb of the barrier layer is 2 nm and where Lb is 6 nm.
Figure 4:
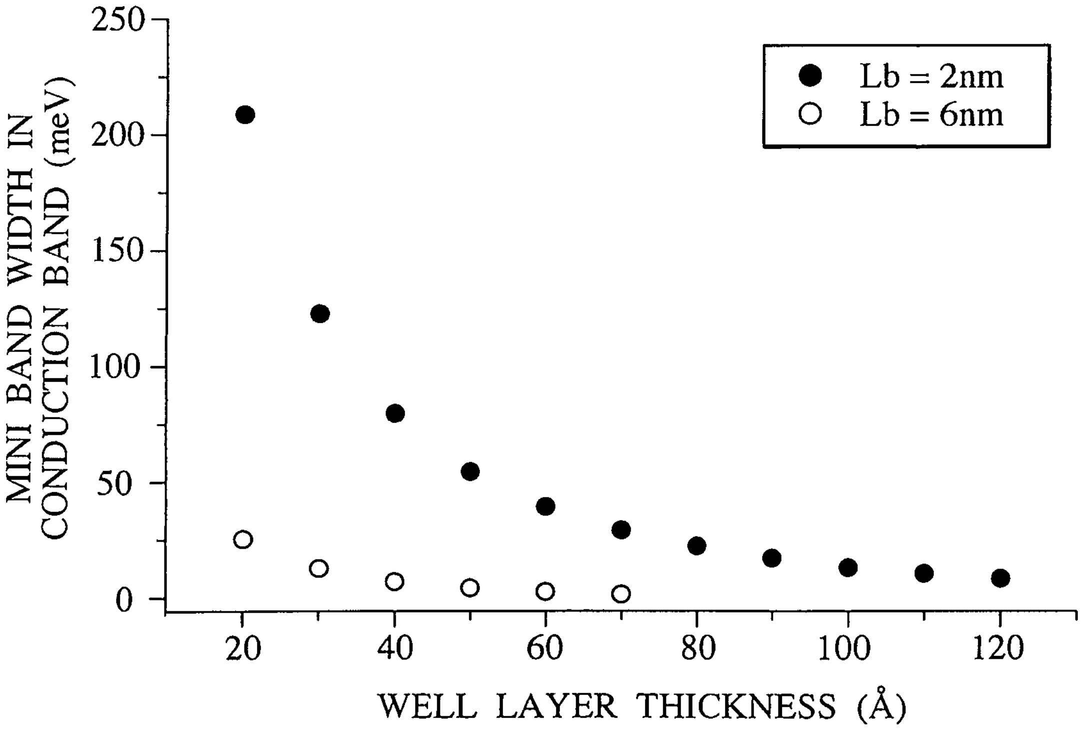
FIG. 4 shows a graph showing a change of a bandwidth of a mini band in a conduction band of the superlattice structure according to a change of a thickness Lw of a well layer, for each of the cases where the thickness Lb of the barrier layer is 2 nm and where Lb is 6 nm.

FIG. 3 shows graphs showing a change of a band gap of the superlattice structure according to a change of thicknesses Lw of a well layer 103, for the case where the thickness Lb of the barrier layer is 2 nm and where Lb is 6 nm. FIG. 4 shows a graph showing a bandwidth of a mini band in a conduction band 201 according to a thickness Lw of a well layer 103, for each of the cases where the thickness Lb of the barrier layer 104 is 2 nm and where Lb is 6 nm.

Figure 5:
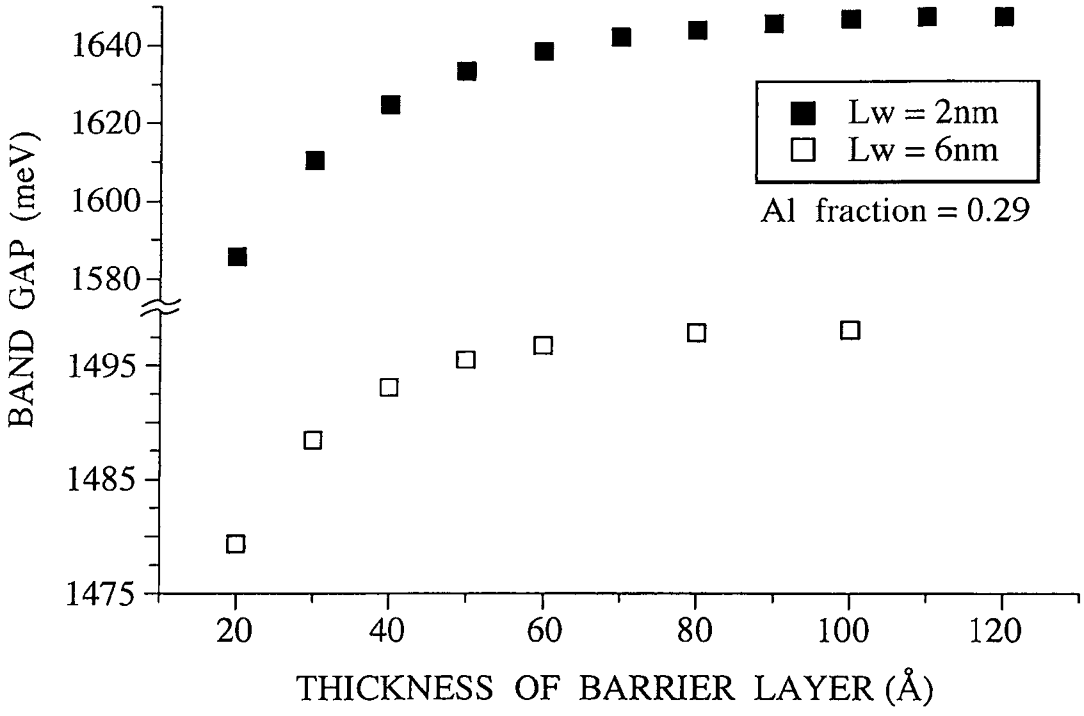
FIG. 5 shows a graph showing a change of a band gap of the superlattice structure according to a change of a thickness of a barrier Lb, for each of the cases where the thickness Lw of the well layer is 2 nm and where Lw is 6 nm.
Figure 6:
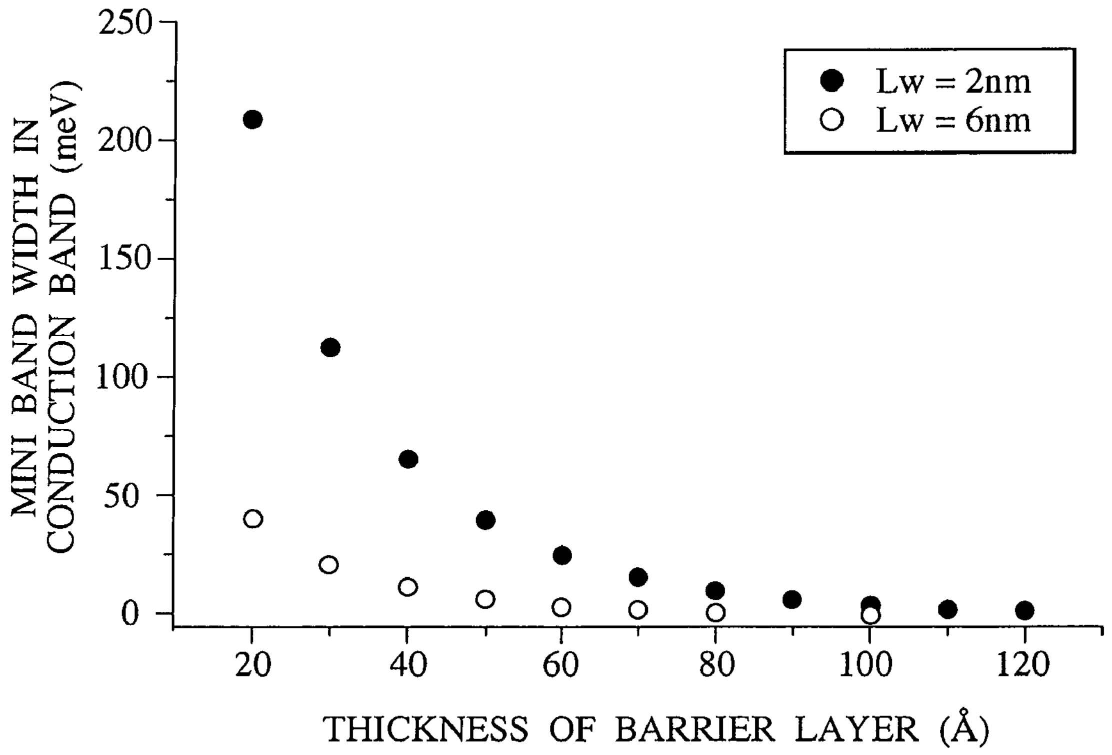
FIG. 6 shows a graph showing a change of a bandwidth of a mini band in a conduction band of the superlattice structure according to a change of a thickness Lb of a barrier layer, for each of the cases where the thickness Lw of the well layer is 2 nm and where Lw is 6 nm.

FIG. 5 shows a graph showing changes of band gaps of the superlattice structure according to a thickness Lb of a barrier layer 104, for the case where the thickness Lw of the well layer 103 is 2 nm and where Lw is 6 nm FIG. 6 shows a graph showing a bandwidth of a mini band 211 in a conduction band 201 of the superlattice structure according to a thickness Lb of a barrier layer 104, for each of the cases where the thickness Lw of the well layer is 2 nm and where Lw is 6 nm.

The following facts become apparent from the simulation results.

In order to achieve a high energy state density and a large band gap that achieve a high quantum efficiency, Lw is preferably 4 nm or less. In order to achieve a large band gap, narrowing the thickness Lw of the well layer 103 is more effective than narrowing the thickness Lb of the barrier layer 104. Further, it is desirable that the thickness Lb of the barrier layer 104 is at maximum 6 nm or so.

That is, when a desired width of band gap is given to achieve a quantum efficiency, the upper limits of Lw and Lb can be obtained by simulation.

On the other hand, in order to narrow the width of the mini band 211 in the conductor band 201 to be smaller than a room temperature energy that realizes a small initial emittance, it is desirable that thickness Lw of the well layer 103 and the thickness Lb of the barrier layer 104 are 3 nm at minimum.

That is, when a desired initial emittance is given, the lower limits of Lw and Lb are obtained by simulation.

In this way, the ranges of the thicknesses Lw and Lb of the well layer 103 contained in the superlattice structure 102.

On the other hand, the thickness of the superlattice structure 102 i.e. the total sum of the thicknesses, may be changed according to the size of the photocathode semiconductor device 101 and production cost. Typically, the thickness is 2 μm to 3 μm.

The thickness A of the surface layer 105 is such that almost all of the entering light can reach the superlattice structure 102. Further, the surface layer 105 requires such a high p-type doping concentration as to reduce the electron affinity by half of the band gap or so. Typically, the thickness is 3 nm to 6 nm, and the p-type doping concentration is $5\times10^{18}$ $cm^{-3}$ to $5\times10^{19}$ $cm^{-3}$.

Further, the thickness B of the buffer layer 106 should be such that electrons generated in the substrate layer 107 does not flow to the superlattice structure 102. Typically, the thickness is 1 μm or greater.

The thickness of the substrate layer 107 can be changed also according to the size of the manufactured photocathode semiconductor device 101 and the manufacturing cost.

Figure 7:
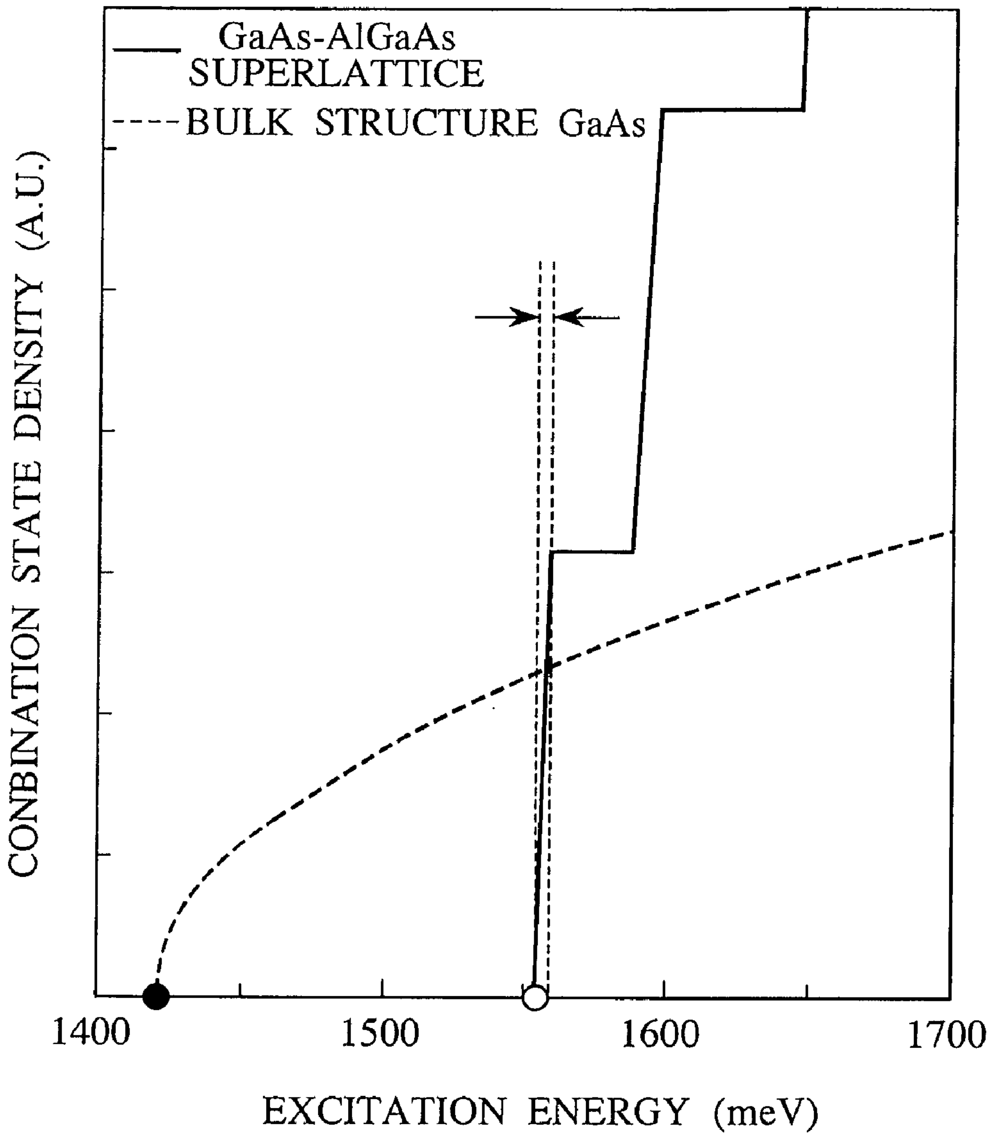
FIG. 7 shows a graph that represents a state density against an excitation energy in a conventional photocathode semiconductor device and a photocathode semiconductor device of the present embodiment.

FIG. 7 shows a graph that represents a state density with respect to the excitation energy in the conventional and the present photocathode semiconductor device. The following explanation references to this diagram.

As shown in this diagram, in the theoretical value (shown by the dotted curve) conventionally presumed, energy state density rapidly increases as the excitation energy increases.

On the other hand, in the photocathode semiconductor device 101 shown by the solid line in the present embodiment, the state density is represented by the stepwise shape, and it is appreciated that the energy state of the electrons in the mini band is singular.

Further, it is also appreciated that the height of each stepwise shape is larger than the conventional theoretical value. This means that the amount of electrons to be generated is amplified, and the quantum efficiency of the electron beam is high.

As describe above, according to the present disclosure, a photocathode semiconductor device provide generation of mono-energetic electrons, high quantum efficiency and its long lifetime by using a superlattice structure. The photocathode semiconductor device is suitable electron source for high brightness and long lifetime.

Various embodiments and changes may be made thereunto without departing from the broad spirit and scope of the disclosure. The above-described embodiments are intended to illustrate the present disclosure, not to limit the scope of the present disclosure. The scope of the present disclosure is shown by the attached claims rather than the embodiment. Various modifications made within the meaning of an equivalent of the claims of the disclosure and within the claims are to be regarded to be in the scope of the present disclosure.

What is claimed is:

1. An electron beam emitting device having a superlattice structure, comprising:

a plurality of well layers made of a first semiconductor; and a plurality of barrier layers made of a second semiconductor that has an electron affinity smaller than that of the first semiconductor, wherein the well layers and the barrier layers deposited alternately, and wherein:

each thickness of the well layers and each thickness of the barrier layers are determined such that a band gap between a lower limit of a first mini band generated in a conduction band and an upper limit of a second mini band generated in a valence band is a given width in an energy state of electrons in the superlattice structure and a bandwidth of the first mini band generated in the conduction band is a given width in the energy state of electrons in the superlattice structure, an energy level in a vacuum is lower than the lower limit of the first mini band generated in the conduction band, and when the superlattice structure is irradiated with a light having such a wavelength that excites electrons from the second mini band generated in the valence band to the first mini band generated in the conduction band, an electron beam having a monochromatized energy state is emitted to the vacuum.

2. An electron beam emitting device having a superlattice structure, comprising:

a plurality of well layers made of a first semiconductor; and a plurality of barrier layers made of a second semiconductor that has an electron affinity smaller than that of the first semiconductor, wherein:

the well layers and the barrier layers are deposited alternately;

each thickness of the well layers and each thickness of the barrier layers are determined such that a band gap between a lower limit of a first mini band generated in a conduction band and an upper limit of a second mini band generated in a valence band is a given width, in an energy state of electrons in the superlattice structure; and an energy state density of the first mini band generated in the conduction band is a desired magnitude, an energy level in a vacuum is lower than the lower limit of the first mini band generated in the conduction band, and when the superlattice structure is irradiated with a light having such a wavelength that excites electrons from the second mini band generated in the valence band to the first mini band generated in the conduction band, an electron beam having a monochromatized energy state is emitted to the vacuum.

3. The electron beam emitting device according to claim 1, wherein:

one end surface of the superlattice structure, referred hereafter to as an electron emission surface, is one of the plurality of well layers and the plurality of barrier layers and hereafter referred to as a top surface side layer, the electron beam emitting device further comprising a surface layer made of a third semiconductor and being in contact with the top surface side layer, wherein the surface layer is treated by negative electron affinity surface treatment.

4. The electron beam emitting device according to claim 3, wherein the light is irradiated to the electron emission surface via the surface layer.

5. The electron beam emitting device according to claim 4, wherein a second end surface of the superlattice structure, hereafter referred to as a substrate surface, is another one of the plurality of well layers and the plurality of barrier layers, hereafter referred to as a substrate-side layer, the electron beam emitting device further comprising:

a buffer layer made of a fourth semiconductor being in contact with the substrate surface; and a substrate layer made of a fifth semiconductor and being in contact with the buffer layer.

6. The electron beam emitting device according to claim 2, wherein one end surface of the superlattice structure, referred hereafter to as an electron emission surface, is one of the plurality of well layers and the plurality of barrier layers and hereafter referred to as a top surface side layer, the electron beam emitting device further comprising a surface layer made of a third semiconductor and being in contact with the top surface side layer, wherein the surface layer is treated by negative electron affinity surface treatment.

7. The electron beam emitting device according to claim 6, wherein the light is irradiated to the electron emission surface via the surface layer.

8. The electron beam emitting device according to claim 7, wherein a second end surface of the superlattice structure, hereafter referred to as a substrate surface, is another one of the plurality of well layers and the plurality of barrier layers, hereafter referred to as a substrate-side layer, the electron beam emitting device further comprising:

a buffer layer made of a fourth semiconductor being in contact with the substrate surface; and a substrate layer made of a fifth semiconductor and being in contact with the buffer layer.

9. An electron beam emitting device having a superlattice structure, comprising:

a plurality of well layers made of a first semiconductor; and a plurality of barrier layers made of a second semiconductor, wherein:

the plurality of well layers and the plurality of barrier layers are deposited alternately;

in an energy state of electrons in the superlattice structure, a first mini band is generated in a conduction band, a second mini band is generated in a valence band, and a lower limit of the first mini band is higher than an upper limit of the second mini band;

an energy level in a vacuum is lower than the lower limit of the first mini band;

and when the superlattice structure is irradiated with a light having such a wavelength that excites electrons from the second mini band to the first mini band, an electron beam having a monochromatized energy state is emitted to the vacuum.

* * * * *